US005087891A

United States Patent [19]

Cytera

[11] Patent Number: 5,087,891

[45] Date of Patent: Feb. 11, 1992

[54] CURRENT MIRROR CIRCUIT

[75] Inventor: Christopher Cytera, Bristol, United Kingdom

[73] Assignee: Inmos Limited, Bristol, United Kingdom

[21] Appl. No.: 536,176

[22] Filed: Jun. 11, 1990

[30] Foreign Application Priority Data

Jun. 12, 1989 [GB] United Kingdom ................ 8913439

[51] Int. Cl.[5] ............................................ H03F 1/26

[52] U.S. Cl. .................................... 330/288; 323/315; 307/276.8

[58] Field of Search ................ 330/288, 277; 323/315, 323/316; 307/296.8

[56] References Cited

U.S. PATENT DOCUMENTS 4,937,469 6/1990 Larson et al. ...................... 330/288

FOREIGN PATENT DOCUMENTS

0052040A1 10/1980 European Pat. Off. .
0045841A1 5/1981 European Pat. Off. .
0356570A1 3/1990 European Pat. Off. .
2070376A 9/1981 United Kingdom .
2206010A 12/1988 United Kingdom .

OTHER PUBLICATIONS

*Electronics Letters;* L. Shofoi, J. E. Heasen; "Negative Current-Mirror Using n-p-n Transitors"; 5/26/77; vol. 13, No. 11, pp. 77–78.

*Primary Examiner*—Eugene R. LaRoche
*Assistant Examiner*—Tan Dinh
*Attorney, Agent, or Firm*—Edward D. Manzo

[57] ABSTRACT

A current mirror circuit has an actively controllable feedback element in the form of a p-channel field effect transistor (28). The p-channel transistor 28 has its gate connected to the output of a differential amplifier (12). The opamp 12 is connected to form a feedback loop within the current mirror circuit. The negative input (14) of the opamp (12) is connected to receive at node (16) the drain voltage V1 of the first transistor (24). The positive input (18) of the opamp (12) is connected to receive at node (20) the drain voltage (V2) of the second transistor (26). The purpose of the opamp 12 is to tend to equalize the drain voltages V1 and V2 of the first and second transistors 24, 26. If the drain voltage V2 of the second transistor 26 increases relative to the drain voltage V1 of the first transistor 24 the output signal Vo of the opamp 12 will be such as to reduce Vgs of the transistor 28 and hence Ids thereby to reduce the drain voltage V2 of the second transistor 26. If the drain voltage V2 of the second transistor 26 falls below the drain voltage V1 of the first transistor 24 the output signal of the opamp 12 will be such as to increase Vgs of the transistor 20, and hence Ids thereby to allow the drain voltage V2 of the second transistor 26 to rise. In this way the nodes 16 and 20 are continuously biased equal.

19 Claims, 3 Drawing Sheets

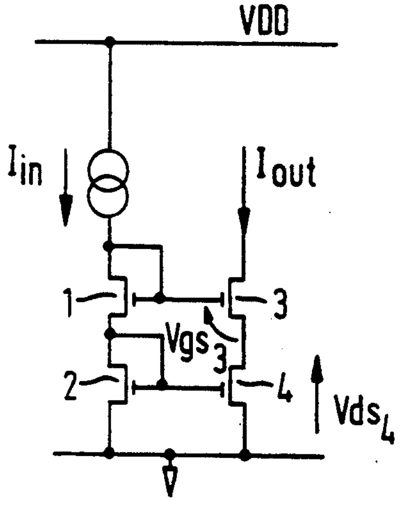
FIG.1
FIG.2
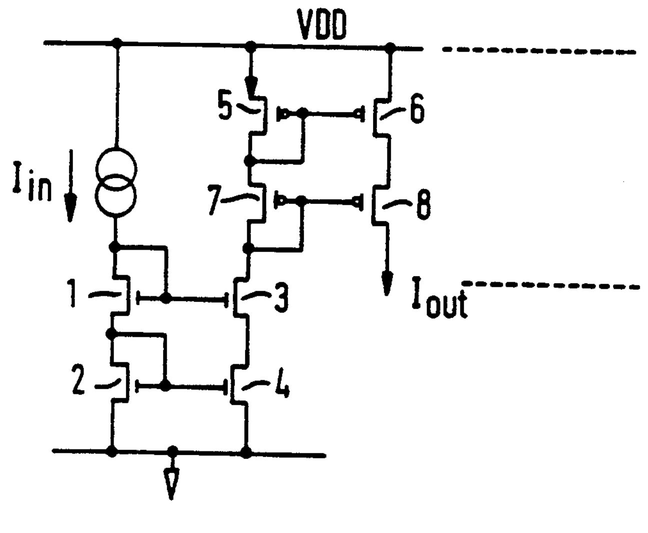

CURRENT MIRROR CIRCUIT

This invention relates to a current mirror circuit.

Current mirror circuits are well known in MOS (metal oxide semiconductor) analogue devices. Essentially they are used to convert a current source to a current sink or vice-versa.

A basic current mirror comprises first and second FET's (field effect transistors) with sources connected to a common fixed potential and their gates connected together. In addition the gate of the first transistor is connected to its drain. A current source is connected in the drain of the first transistor and the output current is taken across a load in the drain of the second transistor. In these circumstances, the ratio of the output to the input current is ideally defined by the ratio of transistor sizes in the current mirror.

However, in practice the accuracy of a current mirror circuit is dependent on other factors, particularly its output impedance. Ideally the impedance should be infinite, or at least very large compared with the load connected to the current mirror. In practice, the impedance of a conventional current mirror circuit is too low for many applications, e.g. high-grain amplifiers.

Current mirror circuits also have application in the production of an output current which is a fixed multiple of an input current, or of several such output currents.

In the drawings:

FIG. 1 is a circuit diagram of a conventional cascode current mirror circuit;

FIG. 2 is a circuit diagram of a conventional cascode current mirror circuit when used to provide an output current which is a multiple of an input current and which can be adapted to provide a plurality of output currents.

Figure 3:
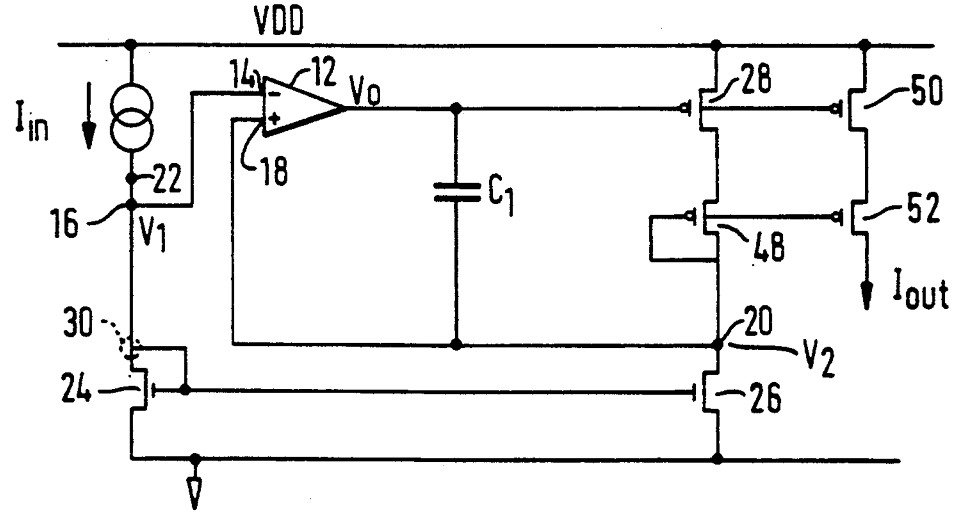
FIGS. 3 to 5 are circuit diagrams of embodiments of the present invention.

FIG. 1 shows a cascode current mirror which has a first transistor pair comprising an n-channel transistor 1 the gate of which is connected to its drain and a second n-channel transistor 3, the gate of which is connected to the gate of the transistor 1. A current source supplying an input current $I_{in}$ is connected in the drain of the first transistor while an output current $I_{out}$ is taken across a load (not shown) connected in the drain of the second transistor 3. A second transistor pair is connected as follows: a third n-channel transistor 2 whose gate is connected both to its drain and also to the gate of a fourth n-channel transistor 4 is connected in the source of the first transistor 1. The fourth transistor 4 is connected in the source of the second transistor 3. Finally, the sources of the third and fourth transistors 2, 4 are connected to ground. In this configuration, if, because of an increase in the drain voltage $Vds_3$ of the second transistor, the output current $I_{out}$ tends to increase relative to its correct value with respect to the input current $I_{in}$ there will be an increase in the drain source voltage $Vds_4$ of the fourth transistor which in turn will tend to reduce the gate source voltage $Vgs_3$ of the second transistor 3. This in turn limits the amount of current which can pass along the drain source channel of the second transistor 3 and hence the output current $I_{out}$ is reduced. The circuit thus utilises negative feedback to be self controlling.

The circuit of FIG. 1 is suitable for converting a current source to a current sink. In some circumstances, it is necessary to use a current mirror type circuit to provide a second current source from an existing source. This may be the case where a second current source of a different value to the existing current source is required or where a plurality of similar current sources is required to be produced from a single current source. The production of multiple current sources is used for example in digital to analogue converters. To achieve this, an "inverted" current mirror circuit is used as the load in the drain of the second transistor 3 (see FIG. 2). The inverted current mirror circuit consists of two current mirror p-channel transistor pairs, 5, 6 and 7, 8, connected in a cascode configuration as described earlier with reference to the transistors 1 to 4 of FIG. 1. The operation of this "inverted" circuit will not be described since it is substantially the same as the arrangement of transistors 1 to 4. Suffice it to say that in order to achieve satisfactory output impedances so that the output current $I_{out}$ bears a predefined and accurate relationship to the input current $I_{in}$ the pair of transistors in each case 1, 3 and 7, 8 is necessary. In a known digital-to-analogue converter current mirror there is a plurality of transistor output arrangements as represented by transistors 6, 8 and as indicated only diagramatically by the dotted lines in FIG. 2.

The circuit illustrated in FIG. 2 has significant disadvantages when implemented on a semiconductor chip for CMOS digital processes with large tolerances. As is known, for a given gate-source voltage (Vgs) the drain-source current (Ids) of an FET is limited by its width/length ratio as implemented in a practical integrated circuit. It is always necessary to specify transistor widths to account for the worst possible case which could arise in processing. With large tolerance processes, this is a serious problem for short transistors, where a change in length due to process tolerances has a greater adverse effect than for transistors of longer length. For typical input currents of the order of 2 mA, the current mirror transistors 1 to 4 may each need to be of a width, W, of the order of 15000 um, and length L of 1-2 um. In terms of the space on a single chip, this is quite costly. In addition, the relationship between Ids, W and the drain-source voltage Vds in a FET means that as the width/length ratio increases, Vds is lowered for the same current. Referring to the circuit of FIG. 2, if the width/length ratio of the p-channel transistors 5 to 8 decreases, Vgs of transistors 5 and 7 must increase to maintain Ids constant. This means that the drain voltage of the n-channel transistor 3 moves closer to ground. If Vgs of transistor 3 is allowed to exceed the sum of its drain-source voltage Vds and threshold voltage Vt, the transistor 3 will move from its saturation region of operation to its linear region. A current mirror designed to operate in the saturation region will be in error in the linear region since small changes in Vds result in large changes in Ids. If the transistor 4 similarly moves out of its saturation region of operation, the error is compounded and the circuit ceases to function sensibly as a current mirror. A reduction in the width/length ratio of transistors 1 to 4 has a similar effect on the operating conditions of transistors 3 and 4. Where, as in the circuit of FIG. 2, there are four transistors connected across the supply voltage $V_{DD}$ to ground, the width/length ratio of each transistor is required to be as high as possible to ensure that even for the worst possible ambient conditions, the transistors remain in saturation. At high temperatures and low supply voltages, it is not possible using the known circuit designs on a large tolerance process to keep the transistors in saturation on without their dimensions being prohibitively large. It is of course also important from the point of view of providing as many circuits as possible on a single chip that transistor widths should be reduced.

According to the present invention there is provided a current mirror circuit comprising first and second MOS field effect transistors, the sources of which are connected to a fixed potential and the gates of which are connected together to receive a common gate voltage, the drain of the first transistor being adapted to be connected to a current source, wherein there is an actively controllable feedback element connected in the drain of the second transistor which feedback element is controllable by a differential amplifier in response to the difference in the drain voltages of the first and second transistors thereby to maintain said drain voltages of the first and second transistors substantially equal to one another.

The use of a differential amplifier with an actively controllable feedback element in this way enables the drain-source voltages of the current mirror transistors to be held equal independently of changes in the operating conditions of the circuit, e.g. the load characteristics (affected by temperature and process tolerance for example) or the supply voltage. As the drain-source voltage of the second transistor is dependent only on the drain-source voltage of the first transistor it is hardly affected by load conditions and hence the current mirror circuit has a higher impedance than conventional current mirror circuits and comparable with cascode current mirror circuits.

However, the feedback control of the drain-source voltage enables the widths of the current mirror transistors to be drastically reduced as compared with a cascode current mirror circuit, to around 1300 um. As the cascode transistors are not required, there are hence less transistors connected across the supply lines and hence fewer problems in keeping them in saturation.

The actively controllable feedback element is preferably an FET transistor whose gate is connected to receive an output signal from the differential amplifier.

Where the circuit of the invention is to be used to generate an output current which is a fixed multiple of an input current, there is preferably connected in the drain of the second transistor a further transistor in series with the actively controllable feedback element. A first output element is driven by the differential amplifier and a second output element is connected in series with the first output element and coupled to the further transistor. Where a plurality of output currents are to be generated, there may be several sets connected in parallel of first and second output elements connected in series, each set providing a respective output current. With this arrangement the circuit of the invention has particular advantage in that the differential amplifier enables bias voltages to be generated for the output elements without using up the quantity of silicon area required with the prior art circuit. Furthermore, each set of first and second output elements, connected in series as a cascaded pair, ensures a high impedance current source.

The further transistor can be driven by forward amplification circuitry coupled to receive the output from the differential amplifier. This enables Vgs of the second FET to be increased independently of the drain voltage of the second transistor, and thus to be turned on more strongly. The transistor can hence be manufactured of an even lower width/length ratio for the same Ids.

The gates of the first and second transistors can be connected to the drain of the first transistor. Preferably, however, the gates of the first and second transistors are connected to receive the common gate voltage from a separate voltage supply circuit.

The independent control of the gate voltage means that Vgs can be made to exceed Vds. This has the significant advantage that a smaller transistor, that is a transistor of lower width/length ratio, can be made to pass the same current as a transistor of larger width/length ratio. Typically, the widths of the current mirror transistors can be reduced to around 360 um. Hence, even taking into account large tolerances, the specifications for transistor widths are greatly reduced.

For a better understanding of the present invention, and to show how the same may be carried into effect, reference will now be made, by way of example, to FIGS. 3 to 5 of the accompanying drawings.

The components of a conventional current mirror circuit can be identified in FIG. 3 as a first n-channel transistor 24 having a current source $I_{in}$ connected in its drain and a second transistor 26 the gate of which is connected to the gate of transistor 24. The sources of the first and second transistors are connected a fixed potential (ground). There is connected in the drain of the second transistor 26 an actively controllable feedback element in the form of a p-channel field effect transistor 28. In the embodiment of FIG. 3, the gates of the transistors 24, 26 are connected to the drain of the first transistor 24 at the node 30. The p-channel transistor 28 has its gate connected to the output of a differential amplifier or opamp 12. The opamp 12 is connected to form a feedback loop within the current mirror circuit. The negative input 14 of the opamp 12 is connected to receive at node 16 the drain voltage V1 of the first transistor 24. The positive input 18 of the opamp 12 is connected to receive at node 20 the drain voltage V2 of the second transistor 26. The purpose of the opamp 12 is to tend to equalise the drain voltages V1 and V2 of the first and second transistors 24, 26. If the drain voltage V2 of the second transistor 26 increases relative to the drain voltage V1 of the first transistor 24 the output signal Vo of the opamp 12 will be such as to reduce Vgs of the transistor 28 and hence Ids thereby to reduce the drain voltage V2 of the second transistor 26. If the drain voltage V2 of the second transistor 26 falls below the drain voltage V1 of the first transistor 24 the output signal of the opamp 12 will be such as to increase Vgs of the transistor 28, and hence Ids thereby to allow the drain voltage V2 of the second transistor 26 to rise. In this way the nodes 16 and 20 are continuously biased equal.

There is connected between the output of the opamp 12 and its positive input 18 a capacitor $C_1$ to stabilise the control loop if the phase margin of the loop is less than 45°.

An output transistor 50 has its gate connected to receive the output signal Vo of the opamp 12 and is driven by this signal. To increase the output impedance of the circuit, a second output transistor 52 is connected in series with the first output transistor 50. A further p-channel transistor 48 is connected in the drain of the second transistor 26 to drive the second output transistor 52, which is connected to receive at its gate the gate voltage Vg of the transistor 48. There may be several output sets of transistors as indicated diagrammatically by the dotted line in FIG. 3. The output transistors 50, 52 are controlled in dependence on the current source $I_{in}$ to produce the output current $I_{out}$ of the current mirror circuit.

Figure 4:
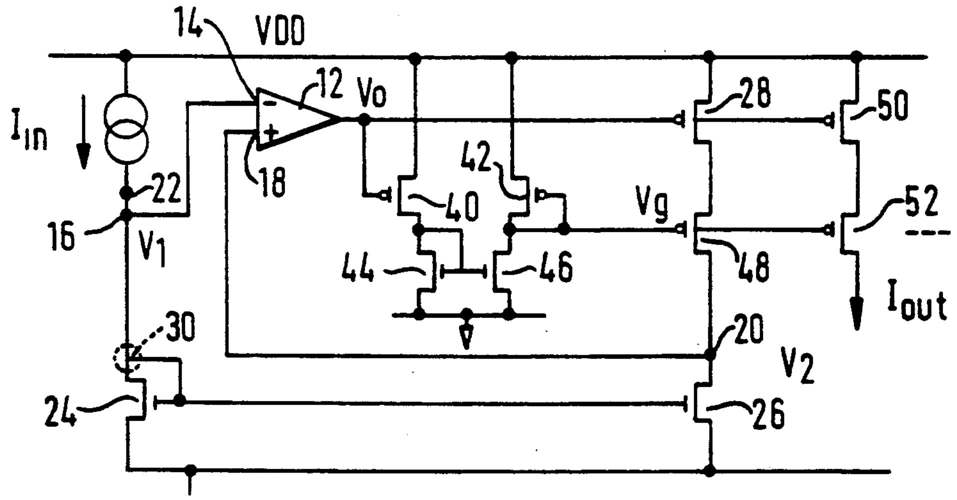

Referring now to FIG. 4, forward amplification circuitry consisting of two p-channel transistors 40, 42 and two n-channel transistors 44, 46 can be connected between the output of the opamp 12 and the gate of the further p-channel transistor 48 which then constitutes a second actively controllable feedback element. The transistors in the amplification circuitry are connected as described in the following: the gate of the p-channel transistor 40 is connected to receive the output voltage $V_o$ from the opamp 12. This transistor 40 is connected between the supply rail VDD and the drain of the n-channel transistor 44. The gate of the transistor 44 is connected to its drain. The source and gate of the n-channel transistor 44 are connected respectively to the source and gate of the n-channel transistor 46. A p-channel transistor 42 is connected in the drain of the transistor 46. The transistor 42 is connected to the supply VDD and its gate is connected both to the drain of the transistor 46 and to the gate of the transistor 48 forming the controllable feedback element.

The purpose of this circuit is to make the gate voltage Vg of the transistor 48 a positive function of the output voltage Vo of the comparator 12. The ratio is given by the following:

$$\frac{VDD - Vo}{VDD - Vg} \simeq K_1\sqrt{\frac{W40}{W42}}$$

Where W40 and W42 are the widths of the transistors 40 and 42 respectively, and K1 is a constant. The effect of the amplification circuitry is to enable the width/length ratio of the transistor 48 to be reduced as discussed earlier.

Figure 5:
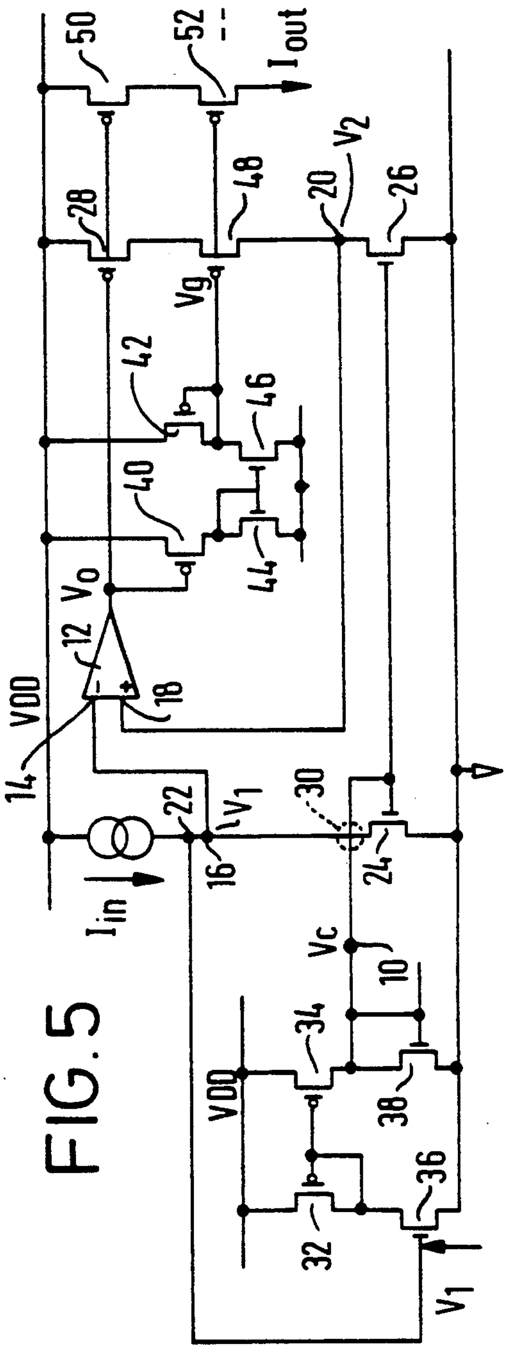

Another embodiment of the invention is shown in FIG. 5. Instead of being connected to the drain of the first transistor 24, the gates of the first and second transistors 24, 26 are connected to receive a control voltage $V_c$ at node 10. The control voltage $V_c$ is derived from amplification circuitry which receives the drain voltage V1 of the first transistor 24 from node 22. The amplification circuitry consists of input and output n-channel transistors 36, 38 with their sources connected to ground. Two p-channel transistors 32, 34 are connected in the drains of the transistors 36, 38 and to the supply rail VDD and their gates are connected together. The gates of the transistors 32, 34 are also connected to the drain of the input transistor 36. The drain of the output transistor 38 is connected to its gate. The circuit operates so that the ratio of $V_c$ to V1 is given by the following:

$$\frac{Vc}{VI} \simeq K_2\sqrt{\frac{W38}{W36}}$$

where W38, W36 are the widths of the transistors 38, 36 respectively, and $K_2$ is a constant. The independent control of $V_c$ and hence the gate voltage of the first and second transistors 24, 26 enables the gate voltage to be held higher than the drain voltage V1 but not so much higher that the transistor comes out of saturation. This has the advantage that more current can be passed for a transistor of the same size in which the gate voltage is tied to the drain voltage. Conversely, a smaller size transistor can be used for existing current values. The first transistor 24 is biased by the voltage supply circuitry 32, 34, 36, 38 closer to the linear region of operation, but nevertheless in saturation. The independent control of feedback elements formed by p-channel transistors 28, 48 has a similar effect in that the width of the transistors can be reduced relative to transistors 5, 7 in FIG. 2 yet still carry the same current. The sizes of the p-channel transistors 28, 48, 40, 42 are chosen so that for the worst cases of highest temperature, lowest supply voltage, maximum transistor length, and highest threshold voltage feedback elements 28, 48 are just into the saturation region. For other cases they will be further into the saturation region.

The reduction of transistor widths made possible by the described circuit is significant, and can be seen from Table I which compares transistor widths for the case (i) of FIG. 2, the case (ii) of FIG. 3, the case (iii) of FIG. 4 and the case (iv) of FIG. 5.

TABLE I (VDD = 4.4 V, Temperature = 100° C.) Dimensions in um.

| | (i) | | | (ii) | | (iii) | | (iv) | |
|---|---|---|---|---|---|---|---|---|---|
| $I_{in}$ | 2.26 | mA | | 2.26 | mA | 2.26 | mA | 2.26 | mA |
| $I_{out}$ | 27.78 | mA | | 27.78 | mA | 27.78 | mA | 27.78 | mA |
| $W_1$ | 14400 | | W24 | 1260 | | 1260 | | 360 | |
| $L_1$ | 1.2 | | L24 | 2.4 | | 2.4 | | 2.4 | |
| $W_2$ | 14400 | | — | — | | — | | — | |
| $L_2$ | 2.4 | | — | — | | — | | — | |
| $W_3$ | 15200 | | W26 | 1330 | | 1330 | | 380 | |
| $L_3$ | 1.2 | | L26 | 2.4 | | 2.4 | | 2.4 | |
| $W_4$ | 15200 | | — | — | | — | | — | |
| $L_4$ | 2.4 | | — | — | | — | | — | |
| $W_5$ | 500 | × 8 | W28 | 136 | × 8 | 64 | × 8 | 64 | × 8 |
| $L_5$ | 2.4 | | L28 | 2.4 | | 2.4 | | 2.4 | |
| $W_6$ | 500 | × 93 | W50 | 136 | | 64 | | 64 | |
| $L_6$ | 2.4 | | L50 | 2.4 | | 2.4 | | 2.4 | |
| $W_7$ | 500 | × 8 | W48 | 136 | × 8 | 64 | × 8 | 64 | × 8 |
| $L_7$ | 1.2 | | L48 | 1.2 | | 1.2 | | 1.2 | |
| $W_8$ | 500 | × 93 | W52 | 136 | | 64 | | 64 | |
| $L_8$ | 1.2 | | L52 | 1.2 | | 1.2 | | 1.2 | |
| $V_{g2}$ | 1.03 | V | V1 | 1.39 | | 1.37 | | 1.34 | |
| $V_{g3}$ | 2.07 | V | V2 | 1.39 | | 1.37 | | 1.34 | |
| $V_{g6}$ | 3.06 | V | Vo | 2.44 | | 1.84 | | 1.84 | |
| $V_{g8}$ | 1.47 | V | Vg | 1.38 | | 0.13 | | 0.13 | |
| | | | $V_{ds28}$ | 3.28 | | 3.69 | | 3.69 | |

TABLE I-continued (VDD = 4.4 V, Temperature = 100° C.) Dimensions in um.

| (i) | (ii) | (iii) | | (iv) |
|---|---|---|---|---|
| | | | $V_{g24}$ | 1.92 |
| | W40 | 100 | | 100 |
| | L40 | 5 | | 5 |
| | W42 | 10 | | 10 |
| | L42 | 5 | | 5 |
| | W44 | 100 | | 100 |
| | L44 | 5 | | 5 |
| | W46 | 100 | | 100 |
| | L46 | 5 | | 5 |
| | | | W32 | 10 |
| | | | L32 | 5 |
| | | | W34 | 10 |
| | | | L34 | 5 |
| | | | W36 | 43.4 |
| | | | L36 | 5 |
| | | | W38 | 10 |
| | | | L38 | 5 |

I claim:

1. A current mirror circuit comprising first and second MOS field effect transistors, the sources of which are connected to receive a fixed potential and the gate electrodes of which are connected together to receive a common gate voltage, the drain of the first transistor having a terminal adapted to be connected to a current source, the circuit further comprising an actively controllable feedback element connected in the drain of the second transistor and a differential amplifier having an output coupled to said feedback element to control said feedback element in response to the difference in the drain voltages of the first and second transistors thereby to maintain said drain voltages of the first and second transistors substantially equal to one another, the output of said differential amplifier being coupled to an output terminal adapted to be connected to an output stage.

2. A circuit as claimed in claim 1 in which the actively controllable feedback element is a field effect transistor with its gate connected to the output of the differential amplifier.

3. A circuit as claimed in claim 1 or 2 which further comprises an output stage connected to said output terminal, the output stage comprising an output element adapted to be driven by the differential amplifier.

4. A circuit as claimed in claim 3 in which the output stage comprises a further output element in series with said output element.

5. A circuit as claimed in claim 3 in which the output element is a field effect transistor.

6. A circuit as claimed in claim 4 which comprises a bias element connected in the drain of the second transistor to bias said further output element.

7. A circuit as claimed in claim 6 in which the bias element is a field effect transistor with its gate connected to its drain.

8. A circuit as claimed in claim 1 or 2 comprising a second feedback element in the drain of the second transistor and in series with the first actively controllable feedback element.

9. A circuit as claimed in claim 8 which further comprises an output stage connected to said output terminal, the output stage comprising a first output element adapted to be driven by the differential amplifier and a second output element in series with said first output element in which the second output element and the second feedback element are field effect transistors with their gates coupled together.

10. A circuit as claimed in claim 9, wherein there is forward amplification circuitry coupled to receive the output of the differential amplifier and arranged to drive the second feedback element and the second output element.

11. A circuit as claimed in claim 3 which comprises a plurality of such output stages to provide a respective plurality of output currents.

12. A circuit as claimed in claim 1, wherein the gates of the first and second transistors are connected to the drain of the first transistor.

13. A circuit as claimed in claim 1 wherein the gates of the first and second transistors are connected to receive the common gate voltage from an independent voltage supply circuit.

14. A circuit as claimed in claim 4 in which the further output element is a field effect transistor.

15. A current mirror circuit comprising first and second MOS field effect transistors, having sources which are connected to a fixed potential and gate electrodes which are connected together to receive a common gate voltage, the drain of the first transistor having a terminal adapted to be connected to a current source, the circuit further comprising;

an actively controllable feedback element connected in the drain of the second transistor;

a differential amplifier having an output coupled to said feedback element to control said feedback element in response to the difference in the drain voltages of the first and second transistors thereby to maintain said drain voltages of the first and second transistors substantially equal to one another, the output of said differential amplifier being coupled to a first output terminal adapted to supply a first reference voltage to an output stage; and a bias element connected in the drain of the second transistor and in series with an actively controllable feedback element, the bias element being coupled to a second output terminal to supply a second reference voltage to the output stage.

16. A circuit as claimed in claim 15 in which the bias element is a field effect transistor with its gate connected to its drain.

17. A current mirror circuit comprising first and second MOS field effect transistors, the sources of which are connected to a fixed potential and the gates of which are connected together to receive a common gate voltage, the drain of the first transistor having a terminal adapted to be connected to a current source, the circuit further comprising;

an actively controllable feedback element connected in the drain of the second transistor;

a differential amplifier having an output coupled to said feedback element to control said feedback element in response to the difference in the drain voltages of the first and second transistors thereby to maintain said drain voltages of the first and second transistors substantially equal to one another, the output of said differential amplifier being coupled to an output terminal adapted to be connected to an output stage;

a second feedback element in the drain of the second transistor and in series with the first actively controllable feedback element; and forward amplification circuitry coupled to receive the output of the differential amplifier and arranged to drive the second feedback element.

18. A circuit as claimed in claim 1 which further comprises a capacitor connected between the output of the differential amplifier and the drain of the second transistor.

19. A circuit as claimed in claim 15 which further comprises a capacitor connected between the output of the differential amplifier and the drain of the second transistor.

* * * * *